(12) United States Patent
Inuma et al.

(10) Patent No.: US 11,782,074 B2
(45) Date of Patent: Oct. 10, 2023

(54) PROBE UNIT

(71) Applicant: NHK Spring Co., Ltd., Yokohama (JP)

(72) Inventors: Tsuyoshi Inuma, Kanagawa (JP); Kazuya Soma, Kanagawa (JP)

(73) Assignee: NHK Spring Co., LTD., Yokohama (JP)

( * ) Notice: Subject to any disclaimer, the term of this patent is extended or adjusted under 35 U.S.C. 154(b) by 156 days.

(21) Appl. No.: 17/295,187

(22) PCT Filed: Nov. 26, 2019

(86) PCT No.: PCT/JP2019/046235
§ 371 (c)(1),
(2) Date: May 19, 2021

(87) PCT Pub. No.: WO2020/111076
PCT Pub. Date: Jun. 4, 2020

(65) Prior Publication Data
US 2022/0011345 A1  Jan. 13, 2022

(30) Foreign Application Priority Data
Nov. 27, 2018 (JP) .................... 2018-221430

(51) Int. Cl.
*G01R 1/073* (2006.01)
*G01R 1/067* (2006.01)

(52) U.S. Cl.
CPC ..... *G01R 1/07314* (2013.01); *G01R 1/06722* (2013.01); *G01R 1/06772* (2013.01)

(58) Field of Classification Search
CPC ............ G01R 1/07314; G01R 1/06722; H01R 2201/20
See application file for complete search history.

(56) References Cited

U.S. PATENT DOCUMENTS 6,037,787 A   3/2000 Corwith
6,844,748 B2  1/2005 Sato et al.
(Continued)

FOREIGN PATENT DOCUMENTS

CN  101160532 A  4/2008
CN  101509937 A  8/2009
(Continued)

OTHER PUBLICATIONS

English translation of JP 6663084 B2, by Hironaka et al. (Year: 2020).*
(Continued)

*Primary Examiner* — Paresh Patel
(74) *Attorney, Agent, or Firm* — Locke Lord LLP

(57) ABSTRACT

A probe unit includes: first contact probes each coming into contact with a target electrode on one end side in a longitudinal direction; a second contact probe connected to an external ground; a signal pipe disposed around each first contact probes; a ground member provided around each signal pipe and configured to form an air layer with the signal pipe; a probe holder including a plate-shaped first and second members; a first wiring part provided at least on a front surface of the first member and electrically connected to the second contact probe; a second wiring part provided at least on a front surface of the second member and electrically connected to the second contact probe; a first conductive unit configured to electrically connect the first wiring part and the ground member; and a second conductive unit configured to electrically connect the second wiring part and the ground member.

13 Claims, 9 Drawing Sheets

(56) References Cited

U.S. PATENT DOCUMENTS

| | | | |
|---|---|---|---|
| 8,535,101 B2 | 9/2013 | Suzuki et al. | |
| 2006/0066331 A1 | 3/2006 | Yoshida et al. | |
| 2006/0139042 A1 | 6/2006 | Kasukabe | |
| 2007/0145991 A1* | 6/2007 | Yoshida | G01R 1/045 324/755.01 |
| 2009/0085593 A1 | 4/2009 | Yoshida et al. | |
| 2010/0041251 A1 | 2/2010 | Nakayama | |
| 2011/0277555 A1 | 11/2011 | Peecock et al. | |
| 2012/0019277 A1 | 1/2012 | Kazama et al. | |
| 2012/0115366 A1 | 5/2012 | Suzuki et al. | |
| 2012/0194213 A1 | 8/2012 | Komatsu et al. | |
| 2014/0015561 A1 | 1/2014 | Chang et al. | |
| 2015/0028911 A1 | 1/2015 | Chang et al. | |
| 2018/0238957 A1 | 8/2018 | Nakamura et al. | |
| 2020/0225265 A1* | 7/2020 | Hironaka | G01R 1/07314 |

FOREIGN PATENT DOCUMENTS

| | | |
|---|---|---|
| CN | 102369447 A | 3/2012 |
| CN | 102549735 A | 7/2012 |
| CN | 103543304 A | 1/2014 |
| CN | 104345186 A | 2/2015 |
| CN | 106771626 A | 5/2017 |
| JP | 2002-506211 A | 2/2002 |
| JP | 2005-351731 A | 12/2005 |
| JP | 2007-178163 A | 7/2007 |
| JP | 2009-85948 A | 4/2009 |
| JP | 2010-038726 A | 2/2010 |
| JP | 2012-098219 A | 5/2012 |
| JP | 2012-103028 A | 5/2012 |
| JP | 2013127408 A | 6/2013 |
| JP | 2016191553 A | 11/2016 |
| KR | 10-2011-0126050 A | 11/2011 |
| TW | I269039 B | 12/2006 |
| WO | 2009011244 A1 | 1/2009 |
| WO | 2019/049482 A1 | 3/2019 |

OTHER PUBLICATIONS

TW Notice of Reasons for Refusal dated Jul. 1, 2020, issued for TW Patent Application No. 108143143 and English translation of the Search Report. four pages.

JP Decision to Grant a Patent dated Aug. 4, 2020, issued for JP Patent Application No. 2020-520832 and English translation thereof. four pages.

Chinese Office Action dated Jun. 30, 2023 for corresponding Chinese Patent Application No. 201980078262.0, 13 pages.

* cited by examiner

PROBE UNIT

FIELD

The present invention relates to a probe unit that accommodates contact probes that input and output signals to and from a predetermined circuit structure.

BACKGROUND

Conventionally, when performing conduction state inspection or operating characteristics inspection of an inspection target such as a semiconductor integrated circuit or a liquid crystal panel, a probe unit including contact probes that establish electric connection between the inspection target and a signal processing device that outputs an inspection signal, and a probe holder that accommodates a plurality of the contact probes is used.

Generally, when a high-frequency electric signal is input or output, a signal loss called insertion loss occurs. In order to operate the probe unit with high accuracy and high speed, it is important to reduce the insertion loss in a frequency domain to be used. For example, Patent Literature 1 discloses a technique of providing an air layer around a contact probe to perform characteristic impedance matching.

CITATION LIST

Patent Literature

Patent Literature 1: JP 2012-98219 A

SUMMARY

Technical Problem

However, although the technique disclosed in Patent Literature 1 can adjust the impedance of a central portion of the contact probe, the technique cannot adjust the characteristic impedance of a tip portion and a proximal portion. The present invention has been made in view of the above description, and an object of the present invention is to provide a probe unit that can adjust the characteristic impedance of the entire contact probe.

Solution to Problem

To solve the above-described problem and achieve the object, a probe unit according to the present invention includes a plurality of first contact probes each coming into contact with a target electrode on one end side in a longitudinal direction; a second contact probe connected to an external ground; a signal pipe disposed around each of the first contact probes; a ground member provided around each signal pipe and configured to form an air layer with the signal pipe; a probe holder including a plate-shaped first member configured to hold a first end of each of the first and second contact probes, the signal pipe, and the ground member, and a plate-shaped second member configured to hold a second end of each of the first and second contact probes, the signal pipe, and the ground member; a first wiring part provided at least on a front surface of the first member and electrically connected to the second contact probe; a second wiring part provided at least on a front surface of the second member and electrically connected to the second contact probe; a first conductive unit configured to electrically connect the first wiring part and the ground member; and a second conductive unit configured to electrically connect the second wiring part and the ground member.

Moreover, the above-described probe unit according to the present invention further includes a filling member configured to be filled between the first and second members.

Moreover, the above-described probe unit according to the present invention further includes a second ground member provided around the second contact probe.

Moreover, in the above-described probe unit according to the present invention, the first and second conductive units are through holes.

Moreover, in the above-described probe unit according to the present invention, the first conductive unit includes the plurality of through holes disposed in an annular shape surrounding the first end of the first contact probes, and the second conductive unit includes the plurality of through holes disposed in an annular shape surrounding the second end of the first contact probes.

Moreover, in the above-described probe unit according to the present invention, the through holes have a hole shape in which a partial inner diameter is different.

Moreover, the above-described probe unit according to the present invention further includes a first conductive part provided in the first member and electrically connected to the first end of the first contact probes and the first end of the signal pipe; and a second conductive part provided in the second member and electrically connected to the second end of the first contact probes and the second end of the signal pipe.

Moreover, the above-described probe unit according to the present invention further includes a hollow cylindrical dielectric provided in the air layer.

Moreover, in the above-described probe unit according to the present invention, the dielectric is provided at the first end and/or the second end of the first contact probes in the air layer.

Moreover, in the above-described probe unit according to the present invention, the signal pipe has a stepped shape in which the first end and/or the second end comes into contact with the first end and/or the second end of each of the first contact probes.

Moreover, in the above-described probe unit according to the present invention, the ground member is a tubular ground pipe.

Moreover, in the above-described probe unit according to the present invention, the ground pipe and the first conductive unit and/or the second conductive unit are integrally formed, and have a stepped shape in which the first end and/or the second end comes into contact with the first wiring part and/or the second wiring part.

Moreover, in the above-described probe unit according to the present invention, a plurality of through-holes is formed in the ground pipe.

Moreover, in the above-described probe unit according to the present invention, a plurality of the ground pipes having diameters different from each other is provided concentrically.

Advantageous Effects of Invention

The present invention has the effect of being able to adjust the characteristic impedance of the entire contact probe.

DESCRIPTION OF EMBODIMENT

A mode for carrying out the present invention will be described in detail below together with the drawings. Note that the present invention is not limited by the following embodiment. In addition, each of the figures referred to in the following description merely outlines the shape, size, and positional relationship to the extent that details of the present invention can be understood. Therefore, the present invention is not limited to the shape, size, and positional relationship exemplified in each figure.

Embodiment

Figure 1:
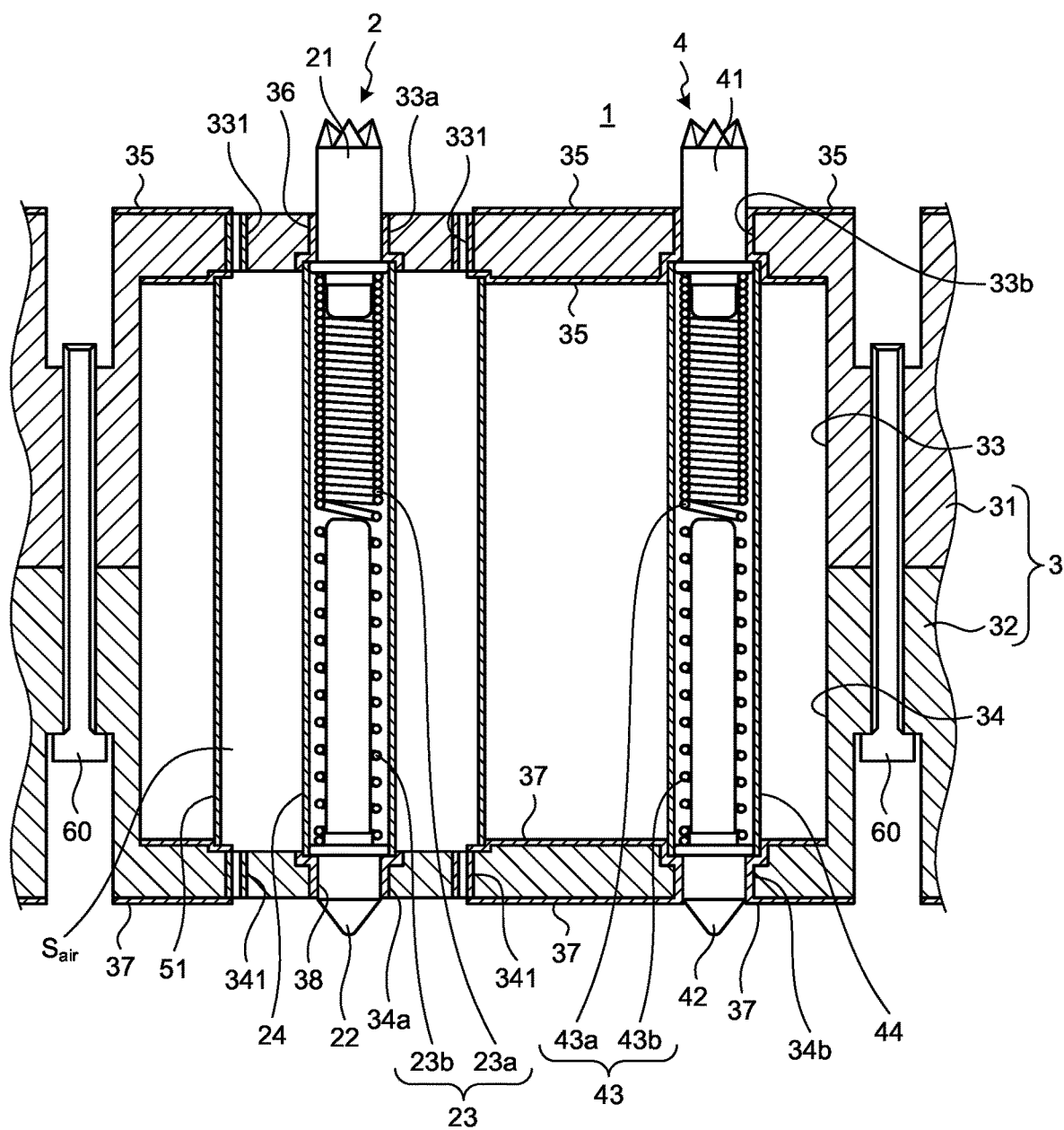
FIG. 1 is a partial sectional view illustrating a configuration of a main part of a probe unit according to an embodiment of the present invention.

FIG. 1 is a partial sectional view illustrating a configuration of a main part of a probe unit according to an embodiment of the present invention. A probe unit 1 illustrated in FIG. 1 is a device to use when performing electrical characteristics inspection of a semiconductor integrated circuit 100, which is an object to be inspected. The probe unit 1 is a device that electrically connects between the semiconductor integrated circuit (semiconductor integrated circuit 100 described later) and a circuit board that outputs inspection signals to the semiconductor integrated circuit (circuit board 200 described later).

The probe unit 1 includes: conductive signal contact probes 2 that come into contact with the semiconductor integrated circuit 100 and the circuit board 200, which are two different contact bodies at both ends in the longitudinal direction, and conducts signals for inspection (hereafter simply referred to as "signal probes 2"); a probe holder 3 that accommodates and holds the signal probes 2 and a ground contact probe 4 described later according to a predetermined pattern; and the ground contact probe 4 that connects to an external ground electrode (hereinafter simply referred to as "ground probe 4"). Note that the probe unit 1 may include a holder member that is provided around the probe holder 3 and inhibits displacement of the semiconductor integrated circuit 100 during inspection.

The signal probe 2 is formed by using a conductive material, and includes: a first plunger 21 that comes into contact with an electrode to which an inspection signal for the semiconductor integrated circuit 100 is input when inspecting the semiconductor integrated circuit 100; a second plunger 22 that comes into contact with an electrode that outputs an inspection signal for the circuit board 200 including an inspection circuit; and a spring member 23 provided between the first plunger 21 and the second plunger 22 to couple the first plunger 21 and the second plunger 22 in an expandable and contractible manner. The first plunger 21, the second plunger 22, and the spring member 23 that constitute the signal probe 2, and a signal pipe 24 have the same axis. The signal probe 2 softens impact on the connecting electrode of the semiconductor integrated circuit 100 by expanding and contracting the spring member 23 in the axial direction when coming into contact with the semiconductor integrated circuit 100, and imposes loads on the semiconductor integrated circuit 100 and the circuit board 200. Note that hereinafter, in the signal probe 2, the side in contact with the electrode of the semiconductor integrated circuit 100 is defined as a tip side, and the side opposite to the semiconductor integrated circuit 100 side in the axial direction is defined as a proximal side. In addition, when prescribing the tip side and the proximal side in the plunger alone, in the plunger that comes into contact with the semiconductor integrated circuit 100, the semiconductor integrated circuit 100 side is defined as the tip side, and the side opposite to the semiconductor integrated circuit 100 side in the axial direction is defined as the proximal side. In addition, in the plunger that comes into contact with the circuit board 200, the circuit board 200 side is defined as the tip side, and the side opposite to the circuit board 200 side in the axial direction is defined as the proximal side.

The first plunger 21 can move in the axial direction by an expansion and contraction action of the spring member 23, is pressed by elastic force of the spring member 23 in the direction of the semiconductor integrated circuit 100, and comes into contact with the electrode of the semiconductor integrated circuit 100. Meanwhile, the second plunger 22 can move in the axial direction by the expansion and contraction action of the spring member 23, is pressed by elastic force of the spring member 23 in the direction of the circuit board 200, and comes into contact with the electrode of the circuit board 200.

In the spring member 23, the first plunger 21 side is a closely wound portion 23a, whereas the second plunger 22 side is a coarsely wound portion 23b. An end of the closely wound portion 23a is coupled to the first plunger 21. Meanwhile, an end of the coarsely wound portion 23b is coupled to the second plunger 22. In addition, the first plunger 21 and the second plunger 22, and the spring member 23 are fitted by winding force of the spring and/or joined by soldering.

In addition, the signal probe 2 is provided with; the signal pipe 24 that accommodates a part of the first plunger 21 and the second plunger 22, and the spring member 23; and a ground pipe 51 surrounding the signal pipe 24. The signal pipe 24 and the ground pipe 51 are each formed by using a conductive material such as copper, silver, an alloy containing copper or silver as a main component, or plating. The signal pipe 24 and the ground pipe 51 have a coaxial structure in which each central axis agrees with the central axis of the signal probe 2.

An air layer $S_{air}$ is formed between the signal pipe 24 and the ground pipe 51. By adjusting the volume of the air layer $S_{air}$, the characteristic impedance of the signal probe 2 is adjusted. The volume of the air layer $S_{air}$ is preferably adjusted by changing the diameter formed by the outer circumference of the signal pipe 24 (outer diameter) and the diameter formed by the inner circumference of the ground pipe 51 (inner diameter).

The ground probe 4 has a configuration similar to the configuration of the signal probe 2. Specifically, the ground probe 4 is formed by using a conductive material, and includes: a first plunger 41 that comes into contact with an electrode for ground of the semiconductor integrated circuit 100 when inspecting the semiconductor integrated circuit 100; a second plunger 42 that comes into contact with an electrode for ground of the circuit board 200; and a spring member 43 provided between the first plunger 41 and the second plunger 42 to couple the first plunger 41 and the second plunger 42 in an expandable and contractible manner. The first plunger 41, the second plunger 42, and the spring member 43 that constitute the ground probe 4 have the same axis.

In the spring member 43, the first plunger 41 side is a closely wound portion 43a, whereas the second plunger 42 side is a coarsely wound portion 43b. An end of the closely wound portion 43a is coupled to the first plunger 41. Meanwhile, an end of the coarsely wound portion 43b is coupled to the second plunger 42. In addition, the first plunger 41 and the second plunger 42, and the spring member 43 are fitted by winding force of the spring and/or joined by soldering.

In addition, the ground probe 4 is provided with a ground pipe 44 that accommodates a part of the first plunger 41 and the second plunger 42, and the spring member 43. The ground pipe 44 is formed by using a conductive material. The ground pipe 44 has a coaxial structure in which each central axis agrees with the central axis of the ground probe 4.

In the present embodiment, the disposition position of each member, the volume of the air layer $S_{air}$, and the like are determined such that the characteristic impedance when the signal probe 2 and the ground probe 4 are regarded as one transmission path becomes a preset value (for example, 50Ω).

The probe holder 3 is formed by using an insulating material such as resin, machinable ceramic, or silicon, and includes a first member 31 positioned on the upper surface side of FIG. 1 and a second member 32 positioned on the lower surface side. The first member 31 and the second member 32 are fixed with a screw 60. Specifically, bottoms of recesses formed in the first member 31 and the second member 32 are brought into abutment with each other, and abutting portions thereof are fixed with the screw 60.

In the first member 31 and the second member 32, hollow portions 33 and 34 are formed to form space that accommodates a plurality of the signal probes 2 and the ground probe 4. In the space formed by the hollow portions 33 and 34, for example, all of the signal probes 2 and the ground probe 4 held by the probe holder 3 are disposed.

In the first member 31, a holder hole 33a that is connected to the hollow portion 33 and inserts and holds the tip side of the signal probe 2, and a holder hole 33b that is connected to the hollow portion 33 and inserts and holds the tip side of the ground probe 4 are formed.

In the second member 32, a holder hole 34a that is connected to the hollow portion 34 and inserts and holds the proximal side of the signal probe 2, and a holder hole 34b that is connected to the hollow portion 34 and inserts and holds the proximal side of the ground probe 4 are formed.

The holder holes 33a and 34a are formed such that axes agree with each other. Meanwhile, the holder holes 33b and 34b are formed such that axes agree with each other.

Formation positions of the holder holes 33a and 33b and the holder holes 34a and 34b are determined according to a wiring pattern of inspection signals for the semiconductor integrated circuit 100.

The holder holes 33a and 33b and the holder holes 34a and 34b both have a stepped hole shape with different diameters along the penetrating direction. That is, each holder hole includes a small-diameter part having an opening on an end face of the probe holder 3 and a large-diameter part having a diameter larger than the small-diameter part. The shape of each holder hole is determined according to the configuration of the signal probe 2 or the ground probe 4 to accommodate.

The first plunger 21 has a function of preventing the signal probe 2 from coming off from the probe holder 3 by a flange abutting against a boundary wall surface between the small-diameter part and the large-diameter part of the holder hole 33a. Meanwhile, the second plunger 22 has a function of preventing the signal probe 2 from coming off from the probe holder 3 by a flange abutting against a boundary wall surface between the small-diameter part and the large-diameter part of the holder hole 34a.

The first plunger 41 has a function of preventing the ground probe 4 from coming off from the probe holder 3 by a flange abutting against a boundary wall surface between the small-diameter part and the large-diameter part of the holder hole 33b. Meanwhile, the second plunger 42 has a function of preventing the ground probe 4 from coming off from the probe holder 3 by a flange abutting against a boundary wall surface between the small-diameter part and the large-diameter part of the holder hole 34b.

A first wiring part 35 that electrically connects the ground probe 4 and the ground pipe 51 is formed on the first member 31. The first wiring part 35 is formed by using a conductive material. The first wiring part 35 forms a part of an outer surface of the first member 31. The first wiring part 35 is formed on the front surface and the back surface of the first member 31 and the inner peripheral surface of the holder hole 33b, and each part is electrically connected. Specifically, the front surface and the back surface of the first wiring part 35 are electrically connected via the inner peripheral surface of the holder hole 33b near the ground probe 4. In addition, the front surface and the back surface are electrically connected via a through hole 331 near the signal probe 2. The through hole mentioned here is, for example, a through-hole in which a conductive film is formed on an inner wall.

The front surface mentioned here refers to the surface on the side opposite to the side where the first member 31 faces the second member 32. Meanwhile, the back surface is the surface opposite to the front surface, and is the surface facing the second member 32 here. Note that the first wiring part 35 may be formed only on the front surface, or may be formed only on the front surface and the inner peripheral surface of the holder hole 33b. When the first wiring part 35 is formed only on the front surface, the first wiring part 35 may be formed such that the position of the end face is aligned with the front surface of the first member 31, or may be formed by extending from the front surface of the first member, that is, covering a part of the holder hole 33b.

The ground probe 4 is electrically connected to the first wiring part 35 by the first plunger 41 or the ground pipe 44 coming into contact with the first wiring part 35 formed in the holder hole 33b.

The ground pipe 51 is electrically connected to the first wiring part 35 by coming into contact with the through hole 331 or the first wiring part 35 formed on the back surface of the first member 31.

In addition, on the first member 31, a first conductive part 36 formed on the inner peripheral surface of the holder hole 33a and electrically connected to the signal probe 2 is formed. The first conductive part 36 is provided independently of the first wiring part 35. The signal probe 2 is electrically connected to the first conductive part 36 by the first plunger 21 and the signal pipe 24 coming into contact with the first conductive part 36. Note that if the signal probe 2 can be electrically connected to the first conductive part 36, at least one of the first plunger 21 and the signal pipe 24 is required to be in contact with the first conductive part 36.

A second wiring part 37 that electrically connects the ground probe 4 and the ground pipe 51 is formed on the second member 32. The second wiring part 37 is formed by using a conductive material. The second wiring part 37 forms a part of an outer surface of the second member 32. The second wiring part 37 is formed on the front surface and the back surface of the second member 32 and the inner peripheral surface of the holder hole 34b, and each part is electrically connected. Specifically, the front surface and the back surface of the second wiring part 37 are electrically connected via the inner peripheral surface of the holder hole 34b near the ground probe 4. In addition, the front surface and the back surface are electrically connected via a through hole 341 near the signal probe 2.

The front surface mentioned here refers to the surface on the side opposite to the side where the second member 32 faces the first member 31. Meanwhile, the back surface is the surface opposite to the front surface, and is the surface facing the first member 31 here. Note that the second wiring part 37 may be formed only on the front surface and the inner peripheral surface of the holder hole 34b.

The ground probe 4 is electrically connected to the second wiring part 37 by the second plunger 42 or the ground pipe 44 coming into contact with the second wiring part 37 formed on the holder hole 34b.

The ground pipe 51 is electrically connected to the second wiring part 37 by coming into contact with the through hole 341 or the second wiring part 37 formed on the back surface of the second member 32.

In addition, on the second member 32, a second conductive part 38 formed on the inner peripheral surface of the holder hole 34a and electrically connected to the signal probe 2 is formed. The second conductive part 38 is provided independently of the second wiring part 37. The signal probe 2 is electrically connected to the second conductive part 38 by the second plunger 22 and the signal pipe 24 coming into contact with the second conductive part 38. If the signal probe 2 can be electrically connected to the second conductive part 38, at least one of the second plunger 22 and the signal pipe 24 is required to be in contact with the second conductive part 38.

The through holes 331 and 341 form cylindrical hollow space, and one or more through holes 331 and 341 are formed around the signal probe 2. For example, eight through holes 331 and 341 are provided at equal intervals around the disposition position of the signal probe 2. The through holes 331 and 341 correspond to a conductive unit.

Figure 2:
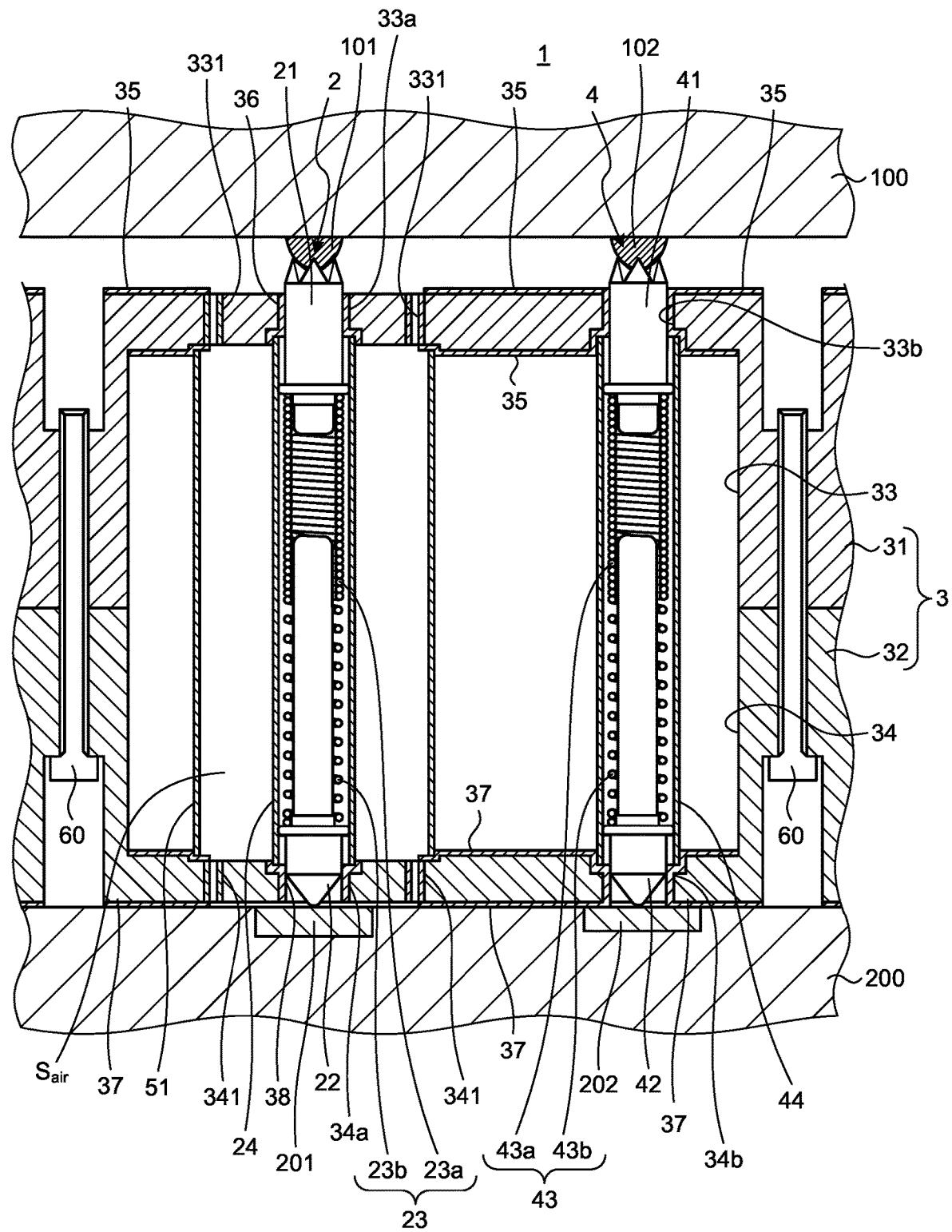
FIG. 2 is a view illustrating a state of a semiconductor integrated circuit during inspection using a probe holder according to the embodiment of the present invention.

FIG. 2 is a view illustrating a state of the semiconductor integrated circuit 100 during inspection in the probe unit 1. During inspection, in the signal probe 2, the first plunger 21 comes into contact with an electrode 101 for the inspection signal of the semiconductor integrated circuit 100, and the second plunger 22 comes into contact with an electrode 201 for the inspection signal of the circuit board 200. Meanwhile, in the ground probe 4, the first plunger 41 comes into contact with an electrode 102 for ground of the semiconductor integrated circuit 100, and the second plunger 42 comes into contact with an electrode 202 for ground of the circuit board 200. During inspection of the semiconductor integrated circuit 100, the spring members 23 and 43 are in a compressed state by a contact load from the semiconductor integrated circuit 100 along the longitudinal direction.

At this time, the first plunger 21 is in contact with the first conductive part 36 and/or the signal pipe 24. Meanwhile, the second plunger 22 is in contact with the second conductive part 38 and/or the signal pipe 24.

In addition, the first plunger 41 is in contact with the first wiring part 35 and/or the ground pipe 44. Meanwhile, the second plunger 42 is in contact with the second wiring part 37 and/or the ground pipe 44.

The inspection signal supplied from the circuit board 200 to the semiconductor integrated circuit 100 during inspection, for example, comes from the electrode 201 of the circuit board 200 and goes through the second plunger 22 of the signal probe 2, the second conductive part 38, the signal pipe 24 (or closely wound portion 23a), the first conductive part 36, and the first plunger 21, and reaches the electrode 101 of the semiconductor integrated circuit 100. In this way, since the first plunger 21 and the second plunger 22 conduct with each other via the signal pipe 24 (or closely wound portion 23a), the signal probe 2 can minimize a conduction path for an electric signal. Therefore, it is possible to prevent a signal from flowing through the coarsely wound portion 23b during inspection and reduce resistance and inductance.

At this time, the path via the second plunger 22, (the second conductive part 38), the signal pipe 24, (the first conductive part 36), and the first plunger 21 is a straighter path than the path via the spring member 23. When conducting a high-frequency signal, the characteristics improve as the path becomes straighter. Therefore, conduction characteristics of a signal can be improved by using the path via the signal pipe 24. Note that the first plunger 21 is preferably in coaxial contact with the electrode 101 in order to bring the path closer to a straight line.

Generally, in an electronic circuit that handles an AC signal, at a place where wires with different impedances are connected to each other, it is known that the signal is reflected by an amount corresponding to a ratio between the different impedances, and that propagation of the signal is hindered. This also applies to the relationship between the semiconductor integrated circuit 100 and the signal probe 2 to use, and when the characteristic impedance of the semiconductor integrated circuit 100 and the characteristic impedance of the signal probe 2 have significantly different values, a loss of an electrical signal occurs, and a waveform of the electrical signal is distorted.

In addition, a rate of signal reflection that occurs at the connection place due to the difference in the characteristic impedance increases as the speed of the semiconductor integrated circuit 100 increases, that is, the frequency increases. Therefore, when manufacturing the probe unit 1 compatible with the semiconductor integrated circuit 100 driven at a high frequency, it is important to accurately adjust the impedance such that the value of the characteristic impedance of the signal probe 2 matches the value of the characteristic impedance of the semiconductor integrated circuit 100.

However, it is not easy to change the shape and the like of the signal probe 2 from the viewpoint of impedance matching. This is because it is difficult to change the shape to a shape suitable for impedance matching from the viewpoint of design and manufacturing because restrictions are inherently given to the signal probe 2 such as suppressing the outer diameter to 1 mm or less and having a complex shape including the first plunger 21, the second plunger 22, and the spring member 23.

Therefore, the present embodiment employs a configuration of adjusting the value of the characteristic impedance by disposing the signal pipe 24 or the ground pipe 51 around the first plunger 21, the second plunger 22 and the spring member 23 instead of changing the structure of the signal probe 2. By employing such a configuration, it is possible to divert the conventional structure of the signal probe 2.

Furthermore, in the present embodiment, by surrounding the end of the signal probe 2 with the plurality of through holes 331 and 341, the value of the characteristic impedance of a tip portion and a proximal portion of the signal probe 2 can be adjusted. Specifically, by adjusting the number of through holes disposed and the disposition of through holes (distance to the signal probe 2), the value of the characteristic impedance can be adjusted.

In the above-described embodiment, the signal pipe 24 and the through holes 331 and 341 are disposed around the signal probe 2, and the external ground is connected via the first wiring part 35, the second wiring part 37, and the ground probe 4. With this configuration, the present embodiment can adjust the characteristic impedance of the tip portion and the proximal portion of the signal probe 2 while being connected to the external ground by the through holes 331 and 341. According to the present embodiment, it is possible to adjust the overall characteristic impedance including ends of the signal probe 2. In addition, according to the present embodiment, it is possible to adjust the ground position in the direction orthogonal to the axial direction with respect to the signal probe 2 by adjusting the position of the through holes.

Note that in the above-described embodiment, instead of the through holes 331 and 341, a cylindrical conductive member may be used, or a tubular conductive member may be used. Each conductive member is electrically connected to the first wiring part 35 and the second wiring part 37. In this case, the conductive member corresponds to a conductive unit.

In addition, the signal pipe 24 and the ground pipes 44 and 51 may each have a seamless, integrated configuration, a configuration in which a thin plate is wound in a circle, or a configuration having a joint that connects a plurality of members.

First Modification

Figure 3:
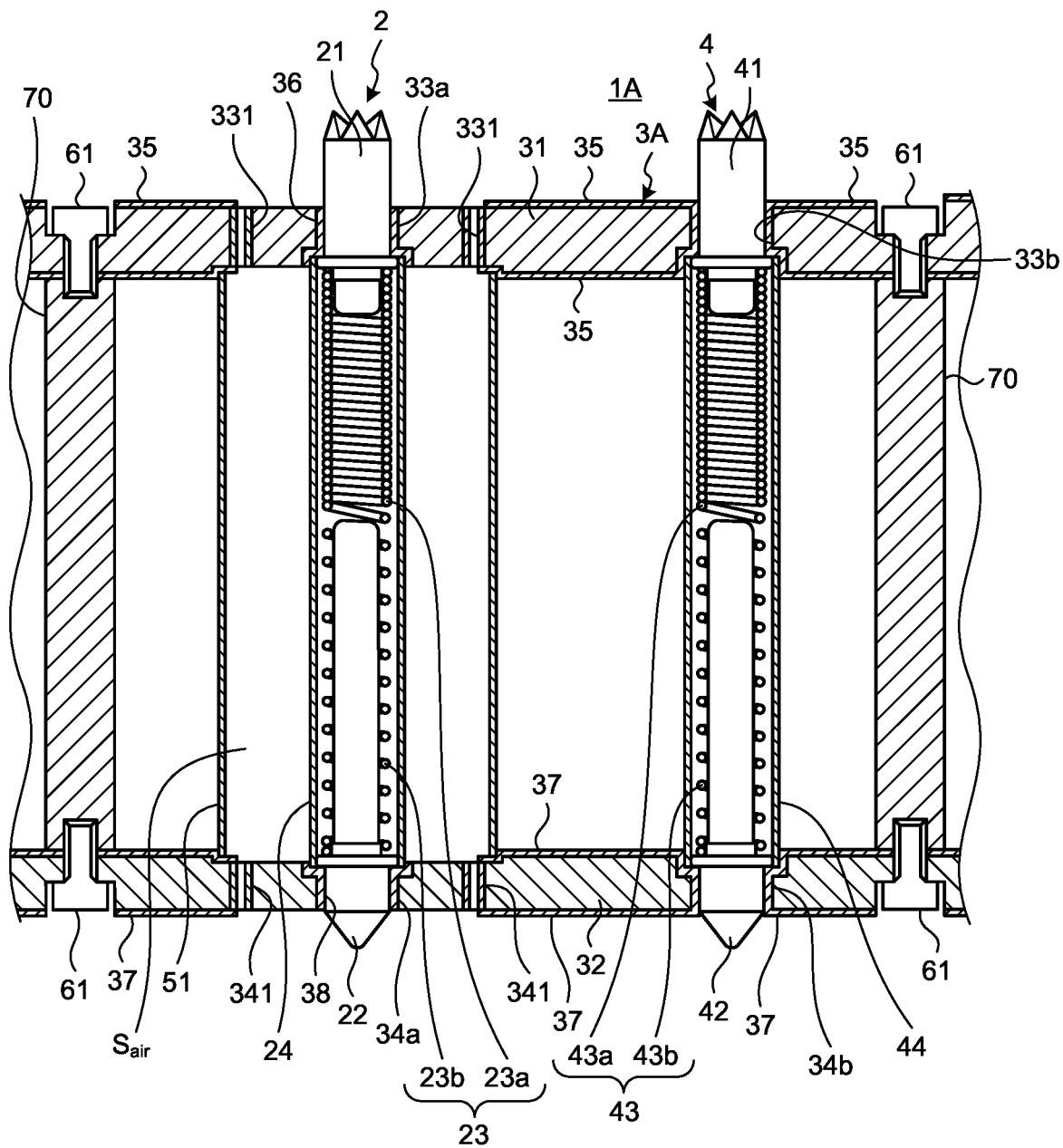
FIG. 3 is a partial sectional view illustrating a configuration of a main part of a probe unit according to a first modification of the embodiment of the present invention.

FIG. 3 is a partial sectional view illustrating a configuration of a main part of a probe unit according to a first modification of the embodiment of the present invention. A probe unit 1A according to the first modification includes a probe holder 3A in place of the probe holder 3 described above. Other configurations are the same as the configuration of the probe unit 1, and thus descriptions thereof will be omitted. In the probe holder 3A, a first member 31 and a second member 32 are fixed with a screw 61 and a strut 70.

As in the first modification, even in a case where the first member 31 and the second member 32 are fixed with the screw 61 and the strut 70, through holes 331 and 341 allow characteristic impedances of a tip portion and a proximal portion of a signal probe 2 to be adjusted while connecting to an external ground. According to the first modification, it is possible to adjust the overall characteristic impedance including ends of the signal probe 2.

Second Modification

Figure 4:
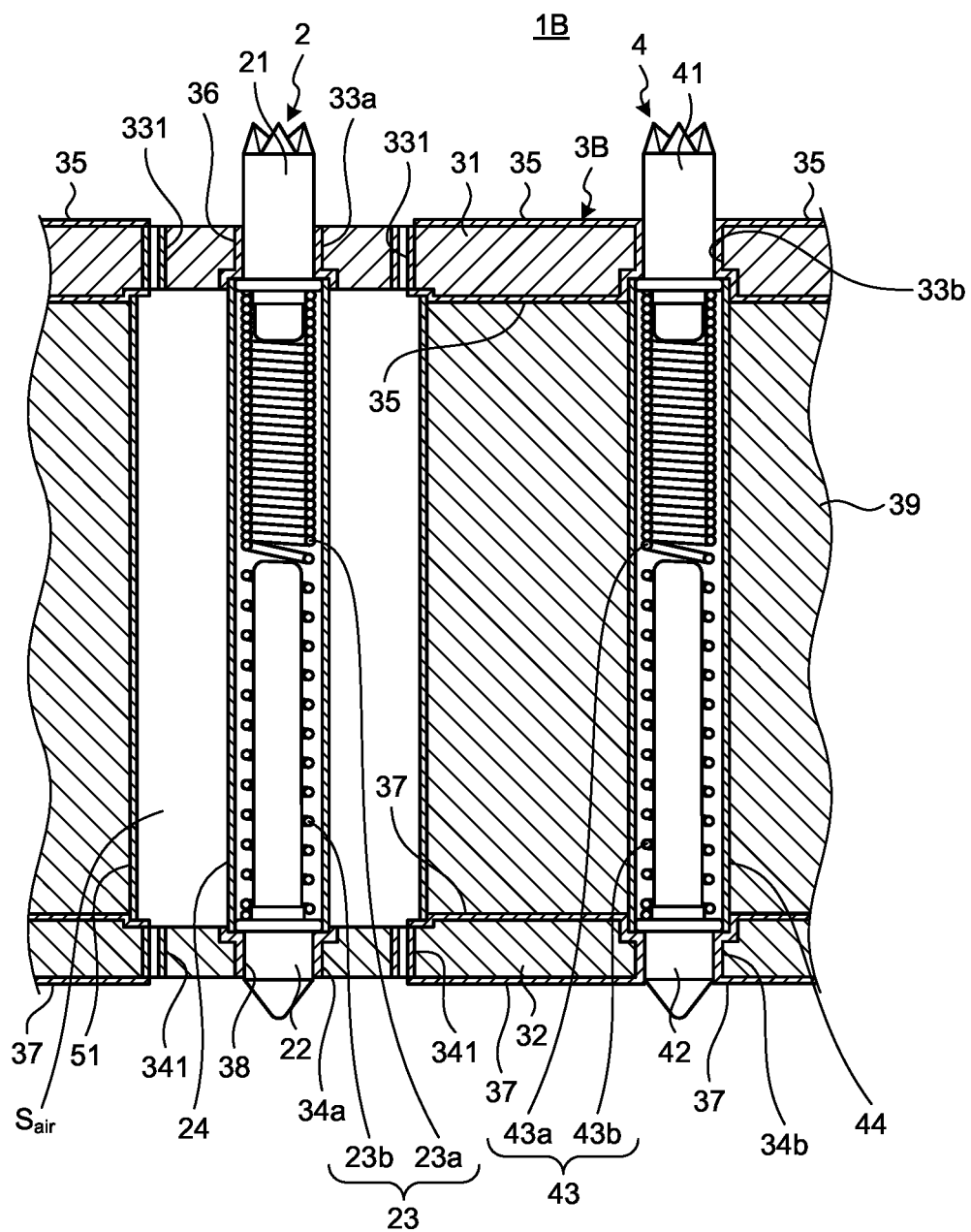
FIG. 4 is a partial sectional view illustrating a configuration of a main part of a probe unit according to a second modification of the embodiment of the present invention.

FIG. 4 is a partial sectional view illustrating a configuration of a main part of a probe unit according to a second modification of the embodiment of the present invention. A probe unit 1B according to the second modification includes a probe holder 3B in place of the probe holder 3 of the probe unit 1 described above. Other configurations are the same as the configuration of the probe unit 1, and thus descriptions thereof will be omitted.

In the probe holder 3B, internal space formed by a first member 31, a second member 32, a ground pipe 51, and a ground pipe 44 is filled with a filling member 39. Examples of a material of the filling member 39 include, but are not limited to, engineering plastics (MDS and the like). Note that the filling member 39 may be a single layer or may include a plurality of layers. In addition, the filling member 39 may be applied to filling between the first member 31 and the second member 32 in the configuration of the embodiment and the first modification.

As in the second modification, even in a case where the filling member 39 is filled in the space formed by the first member 31 and the second member 32, through holes 331 and 341 allow characteristic impedances of a tip portion and a proximal portion of a signal probe 2 to be adjusted while connecting to an external ground. According to the second modification, it is possible to adjust the overall characteristic impedance including ends of the signal probe 2.

Third Modification

Figure 5:
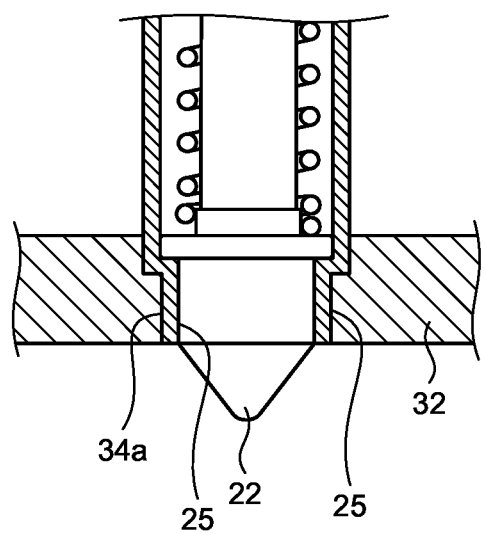
FIG. 5 is a partial sectional view illustrating a configuration of a main part of a probe unit according to a third modification of the embodiment of the present invention.

FIG. 5 is a partial sectional view illustrating a configuration of a main part of a probe unit according to a third modification of the embodiment of the present invention. The probe unit according to the third modification includes a signal pipe 25 in place of the signal pipe 24 of the signal probe 2 of the probe unit 1 described above. Note that the third modification has a configuration that does not include a second conductive part 38 in the probe unit 1. That is, in the third modification, the signal pipe 25 has functions of the signal pipe 24 and the second conductive part 38 described above. Other configurations are the same as the configuration of the probe unit 1, and thus descriptions thereof will be omitted.

The signal pipe 25 is formed by using a conductive material, and has a stepped shape in which an end on a second plunger 22 side corresponds to a holder hole 34a. A flange of the second plunger 22 abuts on the step of the signal pipe 25. This prevents the second plunger 22 from falling out of the signal pipe 25. In addition, during inspection, contact between the signal pipe 25 and the second plunger 22 ensures electrical conduction between the signal pipe 25 and the second plunger 22.

According to the third modification, effects of the above-described embodiment can be obtained, and since the end of the signal pipe 25 has a stepped shape to prevent the second plunger 22 from coming off, it is possible to ensure electrical conduction between the signal pipe 25 and the second plunger 22 without providing the second conductive part 38 described above. In the third modification, unlike the electrical connection by contact between the signal pipe 24 and the second conductive part 38 as in the above-described embodiment, integrated electrical conduction can be achieved, and thus electrical conduction can be ensured more reliably.

Note that although the above-mentioned third modification has been described assuming that the second plunger 22 side has a stepped shape, the configuration according to the third modification may be applied to the first plunger 21 side, or both the first plunger 21 side and the second plunger 22 side may have the configuration according to the third modification.

Fourth Modification

Figure 6:
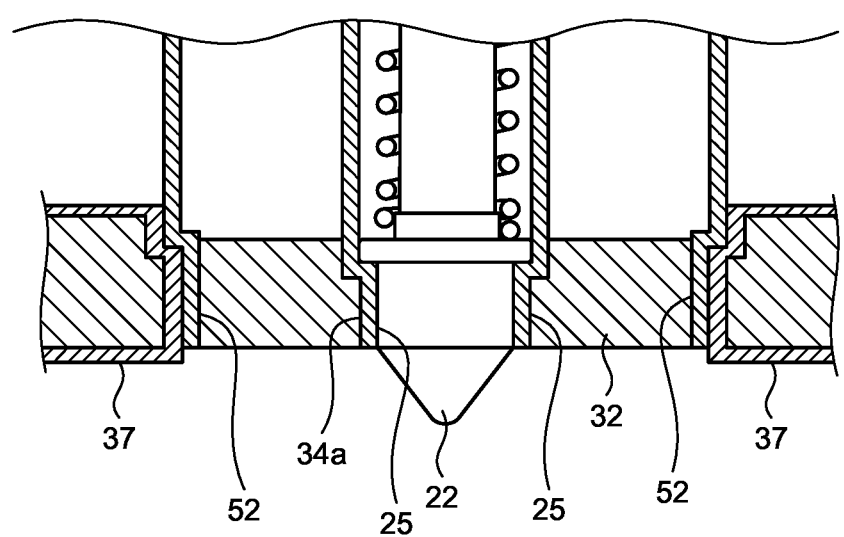
FIG. 6 is a partial sectional view illustrating a configuration of a main part of a probe unit according to a fourth modification of the embodiment of the present invention.

FIG. 6 is a partial sectional view illustrating a configuration of a main part of a probe unit according to a fourth modification of the embodiment of the present invention. The probe unit according to the fourth modification includes a signal pipe 25 in place of the signal pipe 24 of the signal probe 2 of the probe unit 1 described above, and a ground pipe 52 in place of the ground pipe 51. Note that in the probe unit 1, the fourth modification has a configuration in which a front surface and a back surface of a second wiring part 37 are connected near the signal probe 2 without a through hole 341 and a second conductive part 38. That is, in the fourth modification, the ground pipe 52 has functions of the ground pipe 51 and the through hole 341 described above. Other configurations are the same as the configuration of the probe unit 1, and thus descriptions thereof will be omitted. In addition, the signal pipe 25 is the same as in the third modification described above.

The ground pipe 52 is formed by using a conductive material, and an end on the second member 32 side has a stepped shape. The step of the ground pipe 52 is inserted into the second member 32. The end of the ground pipe 52 on the second plunger 22 side may has a configuration of partially extending or a configuration of extending over the entire circumference. The ground pipe 52 inserted into the second member 32 is electrically connected to the second wiring part 37.

According to the fourth modification, since the end of the ground pipe 52 has a stepped shape and is inserted into the second member 32, the characteristic impedance at a tip portion of the second plunger 22 can be adjusted without providing the through hole 341 described above.

Note that in the fourth modification, protrusions may be intermittently provided on the side of the ground pipe 52 to be inserted into the second member 32 so as to be inserted into the through hole 341 described above. In that case, a through-hole may be provided in place of the through hole 341, and the above-mentioned protrusion may be inserted into the through-hole.

In addition, although the above-mentioned fourth modification has been described assuming that the second plunger 22 side has a stepped shape, the configuration according to the fourth modification may be applied to the first plunger 21 side, or both the first plunger 21 side and the second plunger 22 side may have the configuration according to the fourth modification.

Fifth Modification

Figure 7:
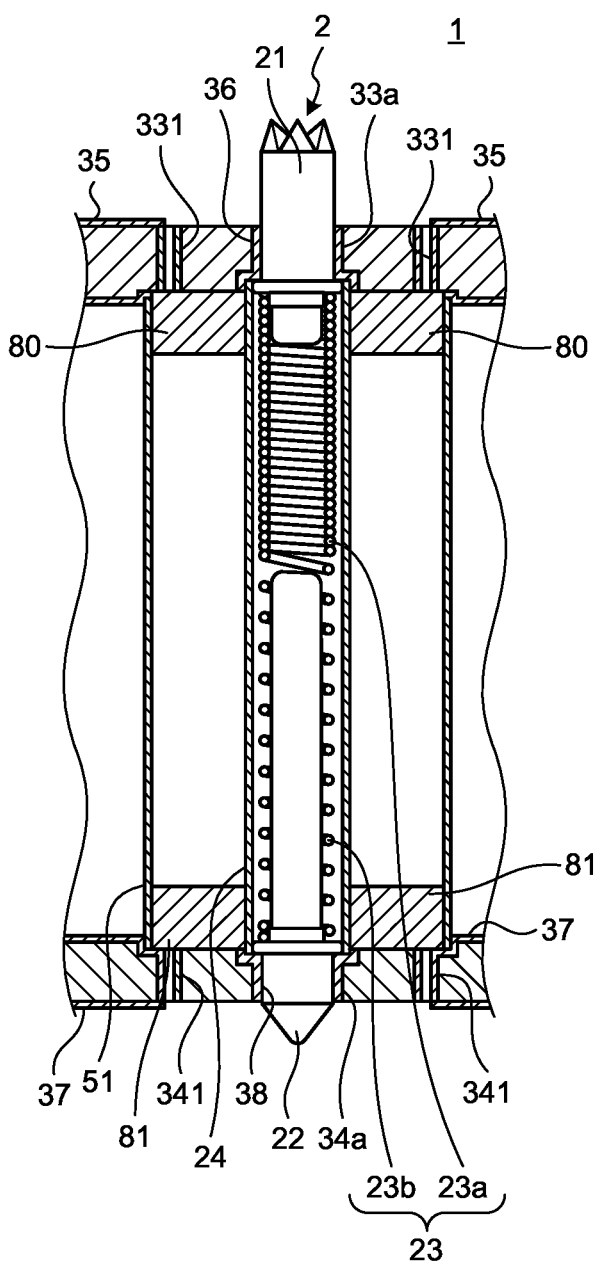
FIG. 7 is a partial sectional view illustrating a configuration of a main part of a probe unit according to a fifth modification of the embodiment of the present invention.

FIG. 7 is a partial sectional view illustrating a configuration of a main part of a probe unit according to a fifth modification of the embodiment of the present invention. The probe unit according to the fifth modification has a configuration in which dielectrics 80 and 81 are provided between the signal pipe 24 and the ground pipe 51 of the signal probe 2 of the probe unit 1 described above. Other configurations are the same as the configuration of the probe unit 1, and thus descriptions thereof will be omitted.

In FIG. 7, the dielectric 80 is provided between the signal pipe 24 and the ground pipe 51 and between ends on the first plunger 21 side. In addition, the dielectric 81 is provided between the signal pipe 24 and the ground pipe 51 and between ends on the second plunger 22 side. Both the dielectrics 80 and 81 have a hollow cylindrical shape.

The dielectric 80 has permittivity between permittivity of a first member 31 and permittivity of air. Meanwhile, the dielectric 81 has permittivity between permittivity of a second member 32 and the permittivity of air. The dielectrics 80 and 81 are formed by using, for example, an insulating material.

For example, when the second member 32 includes ceramic, there is a difference in permittivity between the air having permittivity of 1 and the ceramic having permittivity of 6, and thus reflection increases near a boundary and electrical characteristics deteriorate. Therefore, by disposing the dielectrics 80 and 81 as in the fifth modification, the permittivity between the second member 32, and the signal pipe 24 and the ground pipe 51 gradually changes. Note that the dielectrics 80 and 81 may be a single layer or may include a plurality of layers. In addition, the dielectrics 80 and 81 may be provided near the center in the axial direction in addition to the ends, or may be provided over the entire length of the hollow space. In this case, impedance adjustment, positioning of pipes in the radial direction, and strength of the unit can be improved.

Sixth Modification

Figure 8:
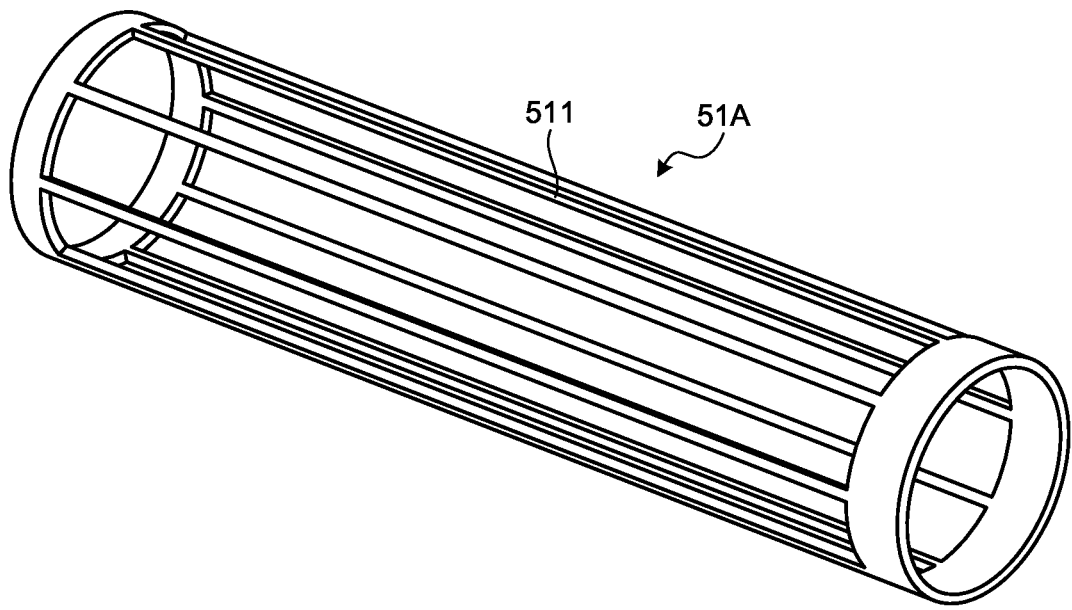
FIG. 8 is a perspective view illustrating a configuration of a main part of a probe unit according to a sixth modification of the embodiment of the present invention.

FIG. 8 is a perspective view illustrating a configuration of a main part of a probe unit according to a sixth modification of the embodiment of the present invention, a configuration of a ground pipe. In the sixth modification, a ground pipe 51A is provided in place of the ground pipe 51 of the probe unit 1 described above. The sixth modification has the same configuration as the configuration of the probe unit 1 except that the ground pipe is changed. Hereinafter, the ground pipe 51A different from the above-described configuration will be described.

The ground pipe 51A is formed by using a conductive material such as copper, silver, an alloy containing copper or silver as a main component, or plating. In the ground pipe 51A, a plurality of through-holes 511 penetrating in the radial direction orthogonal to the longitudinal axis of the ground pipe 51A is formed. The through-holes 511 are holes extending along the longitudinal direction of the ground pipe 51A. The plurality of through-holes 511 is arranged along the circumferential direction.

Seventh Modification

Figure 9:
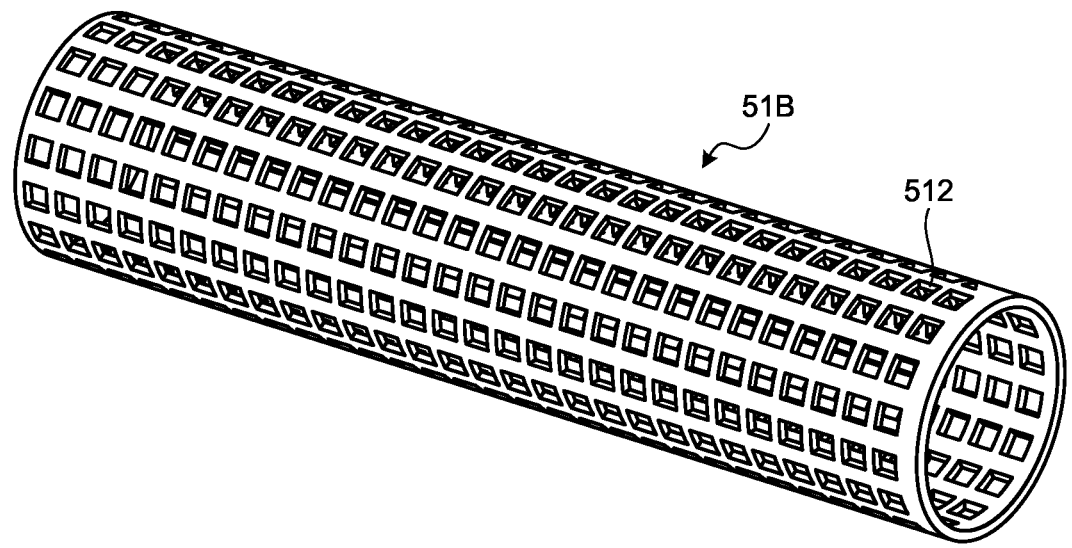
FIG. 9 is a perspective view illustrating a configuration of a main part of a probe unit according to a seventh modification of the embodiment of the present invention.

FIG. 9 is a perspective view illustrating a configuration of a main part of a probe unit according to a seventh modification of the embodiment of the present invention, a configuration of a ground pipe. In the seventh modification, a ground pipe 51B is provided in place of the ground pipe 51 of the probe unit 1 described above. The seventh modification has the same configuration as the configuration of the probe unit 1 except that the ground pipe is changed. Hereinafter, the ground pipe 51B different from the above-described configuration will be described.

The ground pipe 51B is formed by using a conductive material such as copper, silver, an alloy containing copper or silver as a main component, or plating. In the ground pipe 51B, a plurality of through-holes 512 penetrating in the radial direction orthogonal to the longitudinal axis of the ground pipe 51B is formed. The plurality of through-holes 512 is arranged along the longitudinal direction and the circumferential direction of the ground pipe 51B. The ground pipe 51B in which the through-holes 512 are regularly arranged has a mesh shape.

Eighth Modification

Figure 10:
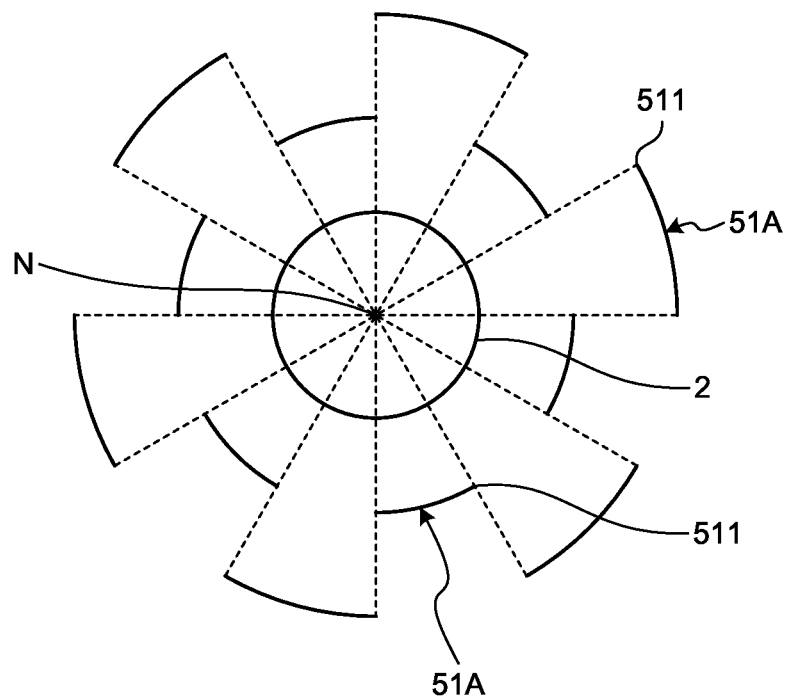
FIG. 10 is a diagram describing disposition of a plunger including a signal pipe and ground pipes in a probe unit according to an eighth modification of the embodiment of the present invention.

FIG. 10 is a diagram describing disposition of a plunger including a signal pipe and ground pipes in a probe unit according to an eighth modification of the embodiment of the present invention. FIG. 10 corresponds to a configuration of a signal probe 2 viewed from the longitudinal direction. In the eighth modification, a probe unit 1 is provided with a plurality of ground pipes in which the above-described through-holes are formed. The eighth modification will be described by taking a configuration having two ground pipes 51A with different diameters as an example. The eighth modification has the same configuration as the configuration of the probe unit 1 except that a ground pipe 51 is changed to the two ground pipes 51A. Note that it is assumed that the size of through-holes 511 is adjusted as appropriate.

The two ground pipes 51A are disposed concentrically about a longitudinal axis N of the signal probe 2 (hereinafter referred to as outer peripheral side ground pipe and inner peripheral side ground pipe). At this time, in the radial direction orthogonal to the longitudinal axis N, either the outer peripheral side ground pipe or the inner peripheral side ground pipe is disposed. That is, the outer peripheral side ground pipe and the inner peripheral side ground pipe are disposed so as to complement holes of the other side in the radial direction of the signal probe 2. That is, when viewed in the radial direction from the signal probe 2, the signal probe 2 is surrounded by either the outer peripheral side ground pipe or the inner peripheral side ground pipe.

In the sixth to eighth modifications described above, even when a plurality of through-holes 511 and 512 is formed in each conductive pipe, there is little outflow of energy to the outside in the ground pipes 51A and 51B. Therefore, an influence of energy loss caused by formation of the through-holes 511 and 512 is small.

In the configuration where through-holes are provided in the ground pipe as in the sixth to eighth modifications described above, since the characteristic impedance can be changed by changing the shape, size, and disposition of the through-holes, the characteristic impedance can be adjusted without changing the signal probe 2 or the signal pipe 24, and the degree of freedom in adjusting the characteristic impedance can be improved.

For example, when narrowing the signal probe 2 in pitch, since there is a limit to diameter reduction of the signal probe 2, the impedance decreases, reflection of a signal increases, and electrical characteristics deteriorate. However, by providing the through-holes 511 and 512 as in the sixth to eighth modifications described above, ground coupling can be weakened and the impedance can be increased. With this configuration, even when the signal probe 2 is narrowed in pitch, it is possible to inhibit deterioration in the electrical characteristics.

Ninth Modification

Figure 11:
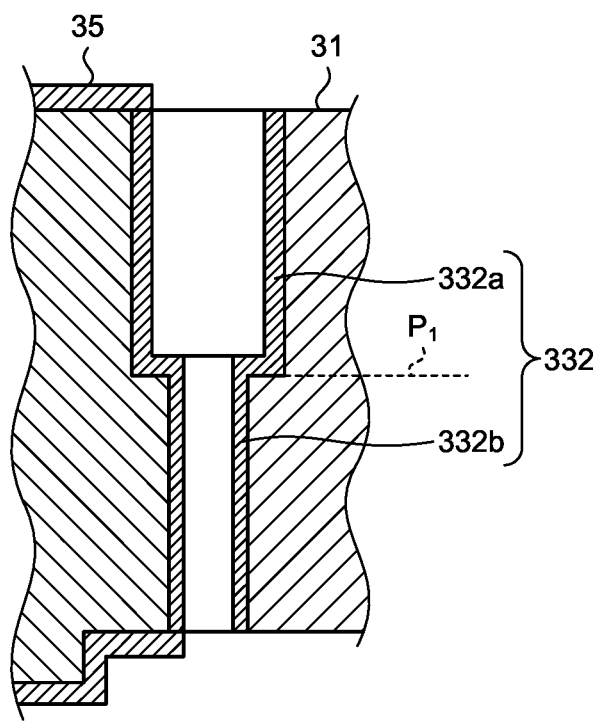
FIG. 11 is a sectional view illustrating a configuration of a main part of a probe unit according to a ninth modification of the embodiment of the present invention.

FIG. 11 is a sectional view illustrating a configuration of a main part of a probe unit according to a ninth modification of the embodiment of the present invention. In the ninth modification, a through hole 332 is formed in place of the above-mentioned through hole 331 in a probe unit 1. The ninth modification has the same configuration as the configuration of the probe unit 1 except that the shape of the through hole is changed. Hereinafter, the through hole 332 different from the above-described configuration will be described.

The through hole 332 is a hole forming hollow space having a stepped shape. A conductive film is formed on an inner wall of the through hole 332 and is connected to a first wiring part 35. Specifically, the through hole 332 includes a first hole 332a forming an opening on the front surface side of a first member 31 (side opposite to the side of lamination on a second member 32), and a second hole 332b connected to the first hole 332a and forming an opening on the back side of the first member 31. The second hole 332b has an inner diameter smaller than the inner diameter of the first hole 332a.

The position of a step formed by the first hole 332a and the second hole 332b is, for example, where a flange of a first plunger 21 is positioned during inspection on an extension line Pi that passes through this position and is orthogonal to an axis of the through hole 332. In that case, the plate thickness of the first member 31 is increased according to a stroke of the first plunger 21.

Note that the relationship of size between the inner diameters of the first hole 332a and the second hole 332b may be reversed.

In the ninth modification, the through hole 332 having a stepped shape is disposed such that the through hole 332 is connected to an external ground via the first wiring part 35. Even when the through hole 332 according to the ninth modification is used, it is possible to adjust the characteristic impedance of a tip portion and a proximal portion of the signal probe 2 while connecting to the external ground. According to the ninth modification, it is possible to adjust the overall characteristic impedance including ends of the signal probe 2.

Tenth Modification

Figure 12:
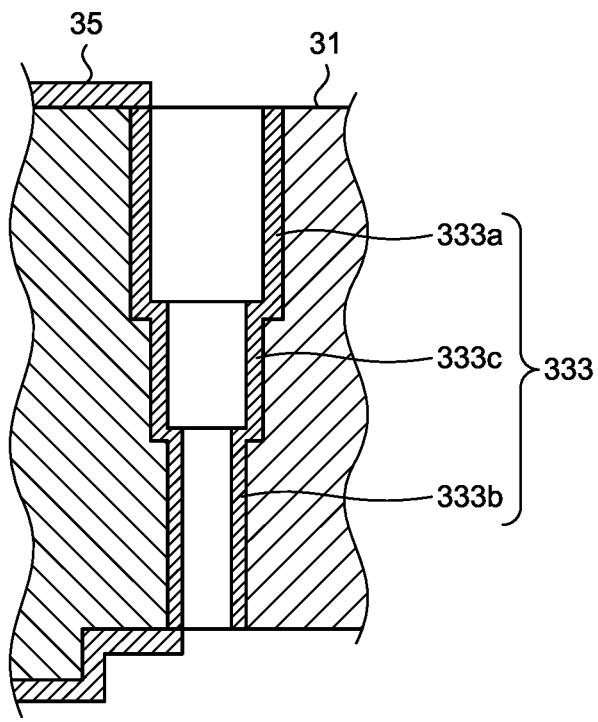
FIG. 12 is a sectional view illustrating a configuration of a main part of a probe unit according to a tenth modification of the embodiment of the present invention.

FIG. 12 is a sectional view illustrating a configuration of a main part of a probe unit according to a tenth modification of the embodiment of the present invention. In the tenth modification, a through hole 333 is formed in place of the above-mentioned through hole 331 in a probe unit 1. The tenth modification has the same configuration as the configuration of the probe unit 1 except that the shape of the through hole is changed. Hereinafter, the through hole 333 different from the above-described configuration will be described.

The through hole 333 is a hole forming hollow space having a three-step stepped shape, and is connected to a first wiring part 35. Specifically, the through hole 333 includes a first hole 333a forming an opening on the upper surface side of a first member 31, a second hole 333b connected to the first hole 333a and forming an opening on the lower surface side of the first member 31, and a third hole 333c positioned between the first hole 333a and the second hole 333b. The third hole 333c has an inner diameter smaller than the inner diameter of the first hole 333a and larger than the inner diameter of the second hole 333b. Note that the relationship of size between the inner diameters of the first hole 333a to the third hole 333c may be different. For example, the third hole 333c may have an inner diameter larger than the inner diameters of the first hole 333a and the second hole 333b, or the third hole 333c may have an inner diameter smaller than the inner diameters of the first hole 333a and the second hole 333b.

In the tenth modification, the through hole 333 having a stepped shape is disposed such that the through hole 333 is connected to an external ground via the first wiring part 35. Even when the through hole 333 according to the tenth modification is used, it is possible to adjust the characteristic impedance of a tip portion and a proximal portion of the signal probe 2 while connecting to the external ground. According to the tenth modification, it is possible to adjust the overall characteristic impedance including ends of the signal probe 2.

Eleventh Modification

Figure 13:
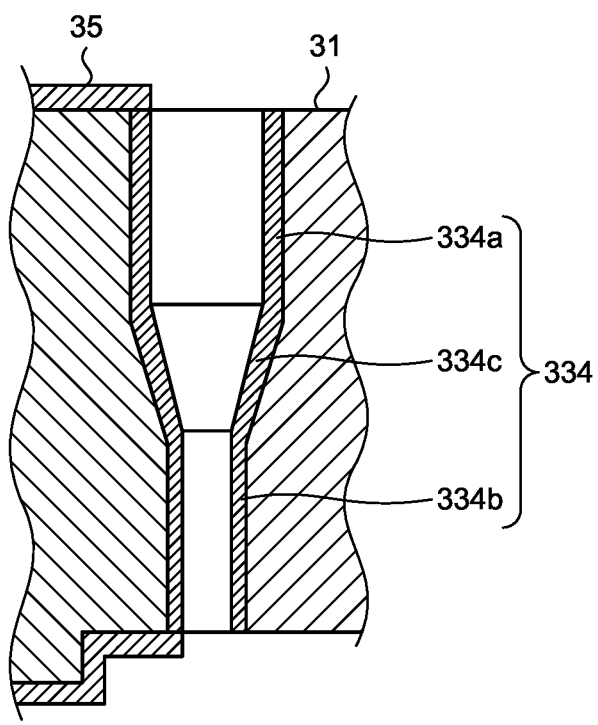
FIG. 13 is a sectional view illustrating a configuration of a main part of a probe unit according to an eleventh modification of the embodiment of the present invention.

FIG. 13 is a sectional view illustrating a configuration of a main part of a probe unit according to an eleventh modification of the embodiment of the present invention. In the eleventh modification, a through hole 334 is formed in place of the above-mentioned through hole 331 in a probe unit 1. The eleventh modification has the same configuration as the configuration of the probe unit 1 except that the shape of the through hole is changed. Hereinafter, the through hole 334 different from the above-described configuration will be described.

The through hole 334 is a hole forming hollow space having a shape in which an inner diameter is reduced from one end to the other end. A conductive film is formed on an inner wall of the through hole 334 and is connected to a first wiring part 35. Specifically, the through hole 334 includes a first hole 334a forming an opening on the upper surface side of a first member 31, a second hole 334b connected to the first hole 334a and forming an opening on the lower surface side of the first member 31, and a third hole 334c positioned between the first hole 334a and the second hole 334b. The inner diameter of the second hole 334b is smaller than the inner diameter of the first hole 334a. The third hole 334c is connected to the first hole 334a and the second hole 334b, and has the inner diameter that continuously decreases from the first hole 334a to the second hole 334b. Note that the relationship of size between the inner diameters of the first hole 334a and the second hole 334b may be reversed.

In the eleventh modification, the through hole 334 with a part decreasing continuously in diameter is disposed such that the through hole 334 is connected to an external ground via the first wiring part 35. Even when the through hole 334 according to the eleventh modification is used, it is possible to adjust the characteristic impedance of a tip portion and a proximal portion of the signal probe 2 while connecting to the external ground. According to the eleventh modification, it is possible to adjust the overall characteristic impedance including ends of the signal probe 2.

It is possible to combine the embodiment and the first modification to the eleventh modification described above as appropriate. In addition, it is also possible to individually select and employ the configuration of each contact probe from the configurations of the embodiment and the first to eleventh modifications.

Note that the configuration of the contact probe described here is merely one example, and various types of conventionally known probes can be applied. For example, the configuration of the contact probe is not limited to the configuration including the plunger and the coil spring as described above, but may be a probe with a pipe member, a pogo pin, a solid conductive member, a conductive pipe, a wire probe that bends a wire in an arch shape to obtain a load, or a connection terminal (connector) that connects electrical contacts, or may be a combination of these probes as appropriate.

In addition, the configuration of the contact probe is not limited to signal probes, and for example, a configuration including the signal probe 2, the signal pipe 24, and the ground pipe 51 may be applied to a power feeding probe.

INDUSTRIAL APPLICABILITY

As described above, the probe unit according to the present invention is suitable for adjusting the characteristic impedance of the entire contact probe.

REFERENCE SIGNS LIST 1, 1A, 1B PROBE UNIT
2 CONTACT PROBE (SIGNAL PROBE)
3, 3A, 3B PROBE HOLDER
4 CONTACT PROBE (GROUND PROBE)
21, 41 FIRST PLUNGER
22, 42 SECOND PLUNGER
23, 43 SPRING MEMBER
23a, 43a CLOSELY WOUND PORTION
23b, 43b COARSELY WOUND PORTION
24, 25 SIGNAL PIPE
31 FIRST MEMBER
32 SECOND MEMBER
33, 34 HOLLOW PORTION
35 FIRST WIRING PART
36 FIRST CONDUCTIVE PART
37 SECOND WIRING PART
38 SECOND CONDUCTIVE PART
39 FILLING MEMBER
44, 51, 51A, 51B GROUND PIPE
80, 81 DIELECTRIC
100 SEMICONDUCTOR INTEGRATED CIRCUIT
101, 102, 201, 202 ELECTRODE
200 CIRCUIT BOARD
331 to 334, 341 THROUGH HOLE

The invention claimed is:
1. A probe unit comprising:
a plurality of first contact probes each coming into contact with an electrode on one end side in a longitudinal direction;
a second contact probe connected to an external ground;
a signal pipe disposed around each of the first contact probes;
a ground member provided around each signal pipe and configured to form an air layer with the signal pipe;
a probe holder including
a plate-shaped first member configured to hold a first end of each of the first and second contact probes, the signal pipe, and the ground member, and a plate-shaped second member configured to hold a second end of each of the first and second contact probes, the signal pipe, and the ground member;

a first wiring part provided at least on a front surface of the first member and electrically connected to the second contact probe;

a second wiring part provided at least on a front surface of the second member and electrically connected to the second contact probe;

a first conductive unit configured to electrically connect the first wiring part and the ground member; and a second conductive unit configured to electrically connect the second wiring part and the ground member, wherein the first and second conductive units are through holes.

2. The probe unit according to claim 1, further comprising a filling member configured to be filled between the first and second members.

3. The probe unit according to claim 1, further comprising a second ground member provided around the second contact probe.

4. The probe unit according to claim 1, wherein
the first conductive unit includes the plurality of through holes disposed in an annular shape surrounding the first end of the first contact probes, and
the second conductive unit includes the plurality of through holes disposed in an annular shape surrounding the second end of the first contact probes.

5. The probe unit according to claim 1, wherein the through holes have a hole shape in which a partial inner diameter is different.

6. The probe unit according to claim 1, further comprising:

a first conductive part provided in the first member and electrically connected to the first end of the first contact probes and the first end of the signal pipe; and a second conductive part provided in the second member and electrically connected to the second end of the first contact probes and the second end of the signal pipe.

7. The probe unit according to claim 1, further comprising a hollow cylindrical dielectric provided in the air layer.

8. The probe unit according to claim 7, wherein the dielectric is provided at the first end and/or the second end of the first contact probes in the air layer.

9. The probe unit according to claim 1, wherein the signal pipe has a stepped shape in which the first end and/or the second end comes into contact with the first end and/or the second end of each of the first contact probes.

10. The probe unit according to claim 1, wherein the ground member is a tubular ground pipe.

11. The probe unit according to claim 10, wherein the ground pipe and the first conductive unit and/or the second conductive unit are integrally formed, and have a stepped shape in which the first end and/or the second end comes into contact with the first wiring part and/or the second wiring part.

12. The probe unit according to claim 10, wherein a plurality of through-holes is formed in the ground pipe.

13. The probe unit according to claim 12, wherein a plurality of the ground pipes having diameters different from each other is provided concentrically for each of the first contact probes about a longitudinal axis of each of the first contact probes.

* * * * *